United States Patent
Obweger

(10) Patent No.: US 10,043,686 B2
(45) Date of Patent: Aug. 7, 2018

(54) APPARATUS FOR TREATING SURFACES OF WAFER-SHAPED ARTICLES

(71) Applicant: LAM RESEARCH AG, Villach (AT)

(72) Inventor: Rainer Obweger, Lind im Drautal (AT)

(73) Assignee: LAM RESEARCH AG, Villach (AT)

( * ) Notice: Subject to any disclaimer, the term of this patent is extended or adjusted under 35 U.S.C. 154(b) by 158 days.

(21) Appl. No.: 14/145,634

(22) Filed: Dec. 31, 2013

(65) Prior Publication Data
US 2015/0187612 A1   Jul. 2, 2015

(51) Int. Cl.
  *H01L 21/67* (2006.01)
  *H01L 21/687* (2006.01)

(52) U.S. Cl.
  CPC .... *H01L 21/67109* (2013.01); *H01L 21/6719* (2013.01); *H01L 21/67126* (2013.01); *H01L 21/67248* (2013.01); *H01L 21/68792* (2013.01)

(58) Field of Classification Search
  USPC ......................................... 156/345.55, 345.37
  See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,485,531 B1 | 11/2002 | Schob | |
| 7,311,585 B2 * | 12/2007 | Togawa | B24B 37/30 |
| | | | 451/388 |
| 2002/0029748 A1 * | 3/2002 | Kuwada | C23C 16/4405 |
| | | | 118/724 |
| 2004/0129224 A1 * | 7/2004 | Yamazaki | C23C 16/4401 |
| | | | 118/724 |
| 2006/0099892 A1 | 5/2006 | Togawa et al. | |
| 2008/0142054 A1 * | 6/2008 | Eitoku | H01L 21/6708 |
| | | | 134/30 |
| 2008/0202425 A1 * | 8/2008 | Gelatos | C23C 16/14 |
| | | | 118/724 |
| 2008/0311295 A1 * | 12/2008 | Ode | C23C 18/00 |
| | | | 427/248.1 |
| 2012/0067847 A1 * | 3/2012 | Sakurai | H01L 21/31111 |
| | | | 216/83 |
| 2013/0008602 A1 * | 1/2013 | Hohenwarter | H01L 21/67115 |
| | | | 156/345.23 |
| 2013/0062839 A1 | 3/2013 | Tschinderle et al. | |

(Continued)

FOREIGN PATENT DOCUMENTS

WO    2007/101764    9/2007

OTHER PUBLICATIONS

First Office Action in Corresponding TW Application No. 103145642 dated Feb. 26, 2018 (in Chinese with English Translation), 11 pages.

*Primary Examiner* — Sylvia MacArthur

(57) ABSTRACT

An apparatus for processing wafer-shaped articles, comprises a closed process chamber providing a gas-tight enclosure. A rotary chuck is located within the closed process chamber, and is adapted to hold a wafer shaped article thereon. A lid is secured to an upper part of the closed process chamber, and comprises a lower surface facing inwardly of the chamber. At least one heating element heats the lower surface of the lid to a desired temperature, so as to prevent condensation of process vapor on the inwardly facing surface of the lid.

7 Claims, 2 Drawing Sheets

(56) References Cited

U.S. PATENT DOCUMENTS

| | | | | |
|---|---|---|---|---|
| 2013/0104940 A1* | 5/2013 | Nagamine | ............ | H01L 21/6715 |
| | | | | 134/30 |
| 2013/0134128 A1* | 5/2013 | Tschinderle | ...... | H01L 21/67051 |
| | | | | 216/58 |
| 2013/0146103 A1* | 6/2013 | Kahlon | ............. | H01L 21/67034 |
| | | | | 134/31 |
| 2013/0160260 A1* | 6/2013 | Frank | ................ | H01L 21/67051 |
| | | | | 29/25.01 |
| 2015/0187612 A1* | 7/2015 | Obweger | .......... | H01L 21/67109 |
| | | | | 216/84 |

* cited by examiner

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

An improved design for closed chamber single wafer wet processing is described in commonly-owned copending application U.S. Pub. No. 2013/0062839, in which a side door permits loading and removal of wafers into and from the process chamber, whereas process liquids and gases may be led into the chamber through a lid secured at the top of the closed process chamber.

Condensation of process vapors on surfaces of the workpiece or on interior surfaces of the chamber can cause undesired variation in process parameters, and droplets of the condensed liquid may even impact the delicate device structures formed on the workpiece, causing damage and reducing throughput.

SUMMARY OF THE INVENTION

The present inventors have developed an improved method and apparatus for treating wafer-shaped articles, as well as an improved lid for use with such a method and apparatus.

Thus, the invention in one aspect relates to an apparatus for processing wafer-shaped articles, comprising a closed process chamber, the closed process chamber comprising a housing providing a gas-tight enclosure. A rotary chuck is located within the closed process chamber, the rotary chuck being adapted to hold a wafer shaped article thereon. A lid is secured to an upper part of the closed process chamber, the lid comprising a lower surface facing inwardly of the chamber and at least one heating element for heating the lower surface to a desired temperature.

In preferred embodiments of the apparatus according to the present invention, the at least one heating element is mounted inside the lid.

In preferred embodiments of the apparatus according to the present invention, the at least one heating element is mounted so as to be in thermal contact with the lid, such that the lower surface of the lid is heated by the at least one heating element.

In preferred embodiments of the apparatus according to the present invention, the lid comprises a lower plate that comprises the lower surface and is formed from a chemically-resistant plastic.

In preferred embodiments of the apparatus according to the present invention, the at least one heating element comprises an electric heating layer.

In preferred embodiments of the apparatus according to the present invention, the at least one heating element comprises a heat exchange conduit supplied with heated liquid.

In preferred embodiments of the apparatus according to the present invention, the lid comprises an upper plate formed from a composite fiber-reinforced material and a lower plate that comprises the lower surface and is formed from a chemically-resistant plastic, the at least one heating element being sandwiched between the upper and lower plates.

In preferred embodiments of the apparatus according to the present invention, the lower plate is formed from a chemically-resistant plastic selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the apparatus according to the present invention, the upper plate is formed from carbon-fiber reinforced plastic.

In preferred embodiments of the apparatus according to the present invention, the carbon-fiber reinforced plastic comprises a binding polymer selected from the group consisting of epoxy, polyester, vinyl ester and nylon.

In preferred embodiments of the apparatus according to the present invention, the apparatus also includes a liquid dispenser configured to supply liquid into the closed process chamber at a selected temperature, and at least one temperature sensor positioned so as to detect a temperature within the closed process chamber, and a controller for controlling the at least one heating element so as to maintain the lower surface at a temperature at least 5 K greater than a temperature of heated liquid supplied by the liquid dispenser.

In another aspect, the present invention relates to a lid for closing a process chamber used for processing wafer-shaped articles, the lid comprising a lower surface facing inwardly of the chamber and at least one heating element for heating the lower surface to a desired temperature.

In preferred embodiments of the lid according to the present invention, the lid comprises a lower plate that comprises the lower surface and is formed from a chemically-resistant plastic.

In preferred embodiments of the lid according to the present invention, the at least one heating element comprises an electric heating layer.

In preferred embodiments of the lid according to the present invention, the at least one heating element comprises a heat exchange conduit supplied with heated liquid.

In preferred embodiments of the lid according to the present invention, the at least one heating element is mounted inside the lid and in thermal contact with the lid, such that the lower surface of the lid is heated by the at least one heating element.

In preferred embodiments of the lid according to the present invention, the lid comprises an upper plate formed from a composite fiber-reinforced material and a lower plate that comprises the lower surface and is formed from a chemically-resistant plastic, the at least one heating element being sandwiched between the upper and lower plates.

In yet another aspect, the present invention relates to a method of wet processing disc-shaped articles, comprising:

positioning a wafer-shaped article in a process chamber closed by a lid having a lower surface facing downwardly into the process chamber;

dispensing a heated liquid onto the wafer-shaped article; and heating the lower surface of the lid to a temperature at least 5 k greater than a temperature of the heated liquid.

In preferred embodiments of the method according to the present invention, the lower surface of the lid is heated by at least one electrical heating element mounted within the lid.

In preferred embodiments of the method according to the present invention, an internal temperature of the closed process chamber is monitored during dispensing of the heated liquid, and the heating of the lower surface of the lid is controlled on the basis of the monitored temperature.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
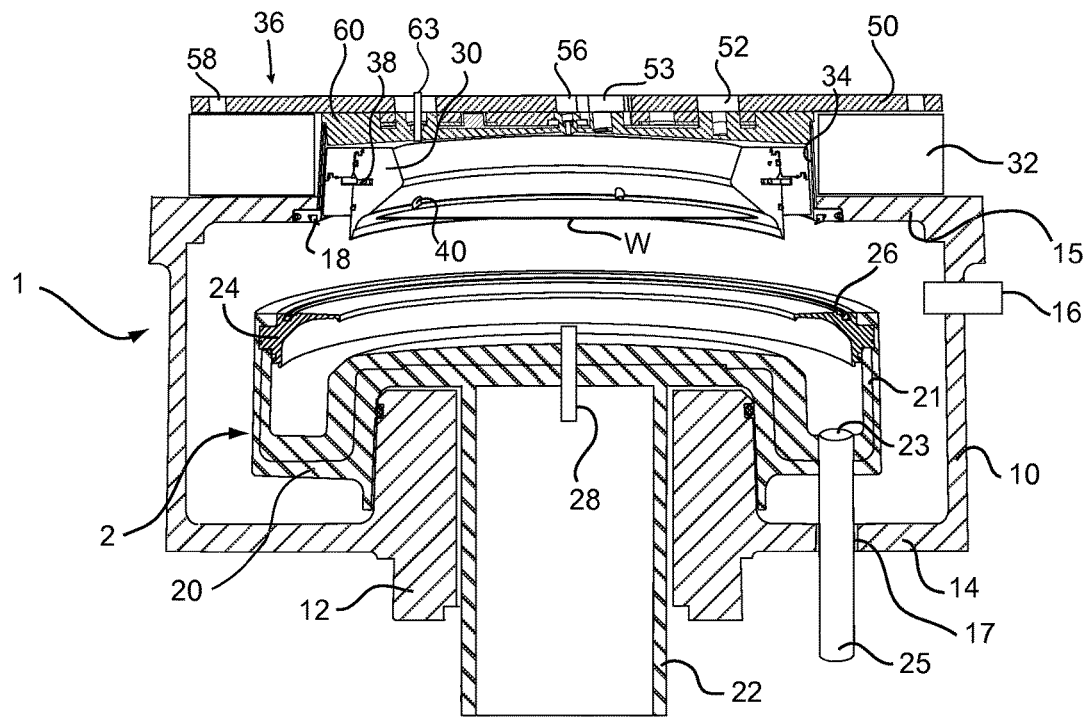
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 32 serve as a motor by which the ring rotor 30 (and thereby a supported wafer W) may be rotated through an active magnetic bearing. For example, the stator 32 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

Figure 3:
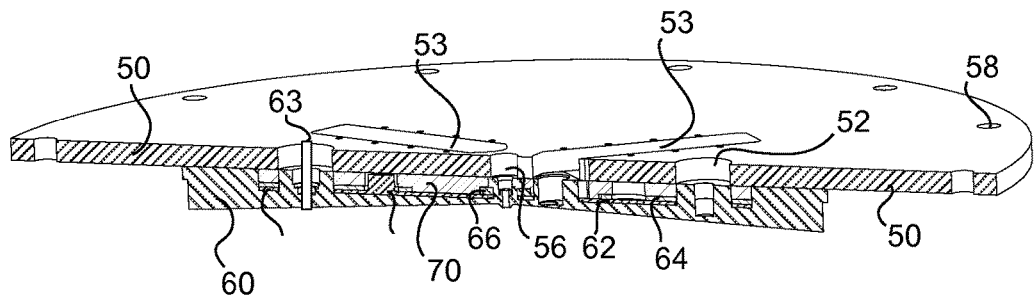
FIG. 3 is a sectional perspective view of an embodiment of a lid according to the present invention.

The lid 36 is of an improved design, and comprises an upper plate 50 formed from a composite fiber-reinforced material and a lower plate 60 that faces into the process chamber and is formed from a chemically-resistant plastic, which in this embodiment is ECTFE. Sandwiched between the upper plate 50 and lower plate 60 in this embodiment is a heating element 62, as shown more clearly in FIG. 3.

Heating element 62 is preferably an electrical heating layer 62 for heating the lower plate 60 to a temperature that prevents condensation of process vapors from occurring on the surface of plate 60 that faces into the process chamber. Electrical heating layer 62 is preferably a silicone rubber heater.

Lid 36 comprises a central opening 56 through which a process liquid or a rinse liquid may be dispensed onto wafer W at a selected temperature. Temperature sensor 63 positioned so as to detect a temperature within the closed process chamber, and provides its output to a controller (not shown) for controlling the heating element 62 so as to maintain the inwardly facing lower surface of lower plate 60 at a temperature that is at least 5 K greater than a temperature of heated liquid supplied by the liquid dispenser.

Alternatively, the heating element 62 may be controlled by monitoring the temperature of the heated liquid itself as it is supplied into the process chamber, so as to maintain the inwardly facing lower surface of lower plate 60 at a temperature that is at least 5 K greater than a temperature of heated liquid supplied by the liquid dispenser Spacer plate 64 serves to maintain the heater layer 62 pressed into contact with lower plate 60, as does the annular spacer 66, which latter element is preferably formed from stainless steel.

This arrangement is effective to prevent condensation of heated process vapors on the surface of lid 36 that faces into the process chamber, and thereby to prevent the disadvantageous effects of the resulting droplets.

It will be appreciated that, by heating the inwardly-facing surface of the lid in the manner described above, the heating element 62 does not heat the wafer; therefore, the temperature of the wafer may if desired be independently controlled by a separate heater mounted inside the process chamber.

The optional stainless steel plate 70 serves to further increase the stiffness of the lid 36 in the region where the lid is traversed by elongated slots 53.

Lid 36 may be secured to the process chamber by bolts 57 that pass through bores 58.

It will be noted that the wafer W in this embodiment hangs downwardly from the rotary chuck 30, supported by the gripping members 40, such that fluids supplied through inlet 56 would impinge upon the upwardly facing surface of the wafer W.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, and is connected to a suitable exhaust conduit.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

Figure 2:
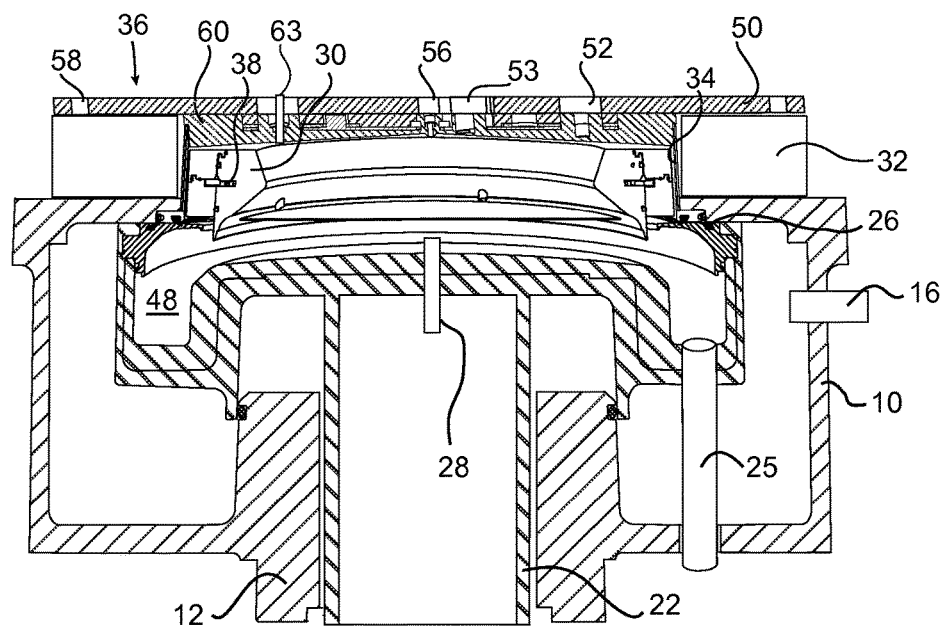
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of the exhaust port 46 opening into the chamber 48, independently from the exhaust port 16 that serves the chamber 1 in general, and the remainder of the chamber 1 in the FIG. 2 configuration.

During processing of a wafer, processing fluids may be directed through medium inlets 56 and/or 28 to a rotating wafer W in order to perform various processes, such as etching, cleaning, rinsing, and any other desired surface treatment of the wafer undergoing processing.

Provision of the inner chamber 48 within the overall process chamber 1 thus enhances the safety of environmentally closed chambers by permitting the gases and liquids used for wafer processing to be better isolated from the exterior environment of the process chamber, and reduces the risk of process gas, chemical fumes, hot vapor such as vaporized isopropyl alcohol, ozone and the like being released to the tool environment.

Figure 4:
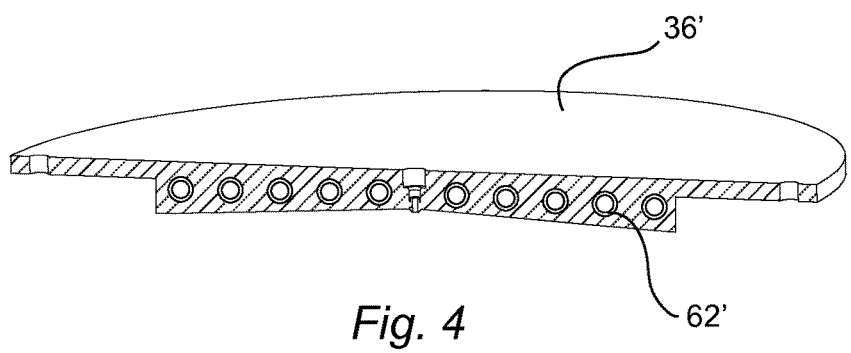
FIG. 4 is a sectional perspective view of another embodiment of a lid according to the present invention.

In FIG. 4, an alternative lid structure 36' is illustrated, in which the lid 36' does not have the sandwiched structure of the preceding embodiments, but instead includes a single plate formed of a single principal material, such as stainless steel coated with perfluoroalkyl (PFA) or composite fiber-reinforced material coated with perfluoroalkyl (PFA) or a chemically resistant plastic such as those described above. The lid structure of this embodiment may be used as an alternative to that described in the preceding embodiments, and vice versa.

Also in this embodiment, the at least one heating element takes the form of a heat exchange conduit 62' supplied with a heat exchange liquid. The other features of the preceding embodiments, such as the temperature sensor and associated control, are not shown in connection with this embodiment, nut it is to be understood that such features may also be included.

It will be understood that the foregoing description and specific embodiments shown herein are merely illustrative of the invention and the principles thereof, and that modifications and additions may be easily made by those skilled in the art without departing from the spirit and scope of the invention, which is therefore understood to be limited only by the scope of the appended claims.

What is claimed is:

1. An apparatus for processing a wafer, the apparatus comprising:
    a closed process chamber comprising a housing, wherein the housing provides a gas-tight enclosure;
    a rotary chuck located within the closed process chamber and adapted to hold the wafer; and
    a lid secured to an upper part of the closed process chamber, wherein the lid comprises
        at least one plate comprising a chemically-resistant plastic and having a lower surface facing inward and at the wafer, wherein the at least one plate comprises an upper plate and a lower plate, and
        at least one heating element for heating the lower surface of the at least one plate to a predetermined temperature, wherein the at least one heating element is disposed between the upper plate and the lower plate, and
    wherein the rotary chuck is disposed adjacent the lid and between the lid and the wafer.

2. The apparatus according to claim 1, further comprising an intermediate plate disposed between the upper plate and the at least one heating element.

3. The apparatus according to claim 2, wherein:
    the upper plate comprises slots; and
    the intermediate plate increases stiffness of the lid in an area of the lid opposite the slots.

4. The apparatus according to claim 2, further comprising a spacer plate disposed between the intermediate plate and the at least one heating element and pressing the at least one heating element against the lower plate.

5. The apparatus according to claim 2, further comprising an annular spacer, wherein:
    the lid comprises a central opening through which a liquid is dispensed into the closed process chamber; and the annular spacer is disposed between the intermediate plate and the central opening.

6. The apparatus according to claim 1, wherein:
the at least one heating element comprises a plurality of heating elements;
the lower plate comprises a plurality of channels; and
the plurality of heating elements are disposed respectively in the plurality of channels.

7. An apparatus for processing a wafer, the apparatus comprising:
a closed process chamber comprising a housing, wherein the housing provides a gas-tight enclosure;
a rotary chuck located within the closed process chamber and adapted to hold the wafer; and
a lid secured to an upper part of the closed process chamber, wherein the lid comprises
at least one plate comprising a chemically-resistant plastic and having a lower surface facing inward and at the wafer, and
at least one heating element for heating the lower surface of the at least one plate to a predetermined temperature, wherein the at least one heating element is implemented as an electric heating layer of the lid, wherein the electric heating layer comprises silicone rubber, and
wherein the rotary chuck is disposed adjacent the lid and between the lid and the wafer.

* * * * *